US009401354B1

(12) United States Patent
Bae (10) Patent No.: US 9,401,354 B1
(45) Date of Patent: Jul. 26, 2016

(54) DISPLAY PANEL HAVING A REDUCED DEAD SPACE

(71) Applicant: SAMSUNG DISPLAY CO., LTD., Yongin-si, Gyeonggi-Do (KR)

(72) Inventor: Han-Sung Bae, Seongnam-Si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/926,820

(22) Filed: Oct. 29, 2015

(30) Foreign Application Priority Data

Apr. 14, 2015 (KR) .................. 10-2015-0052487

(51) Int. Cl.
 *H01L 27/02* (2006.01)
 *H01L 27/32* (2006.01)
 *H01L 51/52* (2006.01)
 *H01L 21/00* (2006.01)

(52) U.S. Cl.
 CPC ........ *H01L 27/0296* (2013.01); *H01L 27/3276* (2013.01); *H01L 51/52* (2013.01); *H01L 2251/5392* (2013.01)

(58) Field of Classification Search
 None
 See application file for complete search history.

(56) References Cited

U.S. PATENT DOCUMENTS

| 7,705,924 | B2 * | 4/2010 | Kim .................. G09G 3/006 324/760.01 |
| RE42,670 | E * | 9/2011 | Park ........................... 257/59 |
| 2005/0046439 | A1 | 3/2005 | Yu |
| 2011/0095290 | A1 * | 4/2011 | Koo ................ G02F 1/1309 257/48 |
| 2013/0242215 | A1 * | 9/2013 | Chang ............. G02F 1/136204 349/41 |
| 2014/0001368 | A1 * | 1/2014 | Huang .................. H02H 9/04 250/370.09 |
| 2015/0049276 | A1 * | 2/2015 | Choi ............... G02F 1/136286 349/42 |
| 2015/0115271 | A1 * | 4/2015 | Yoon ................. H01L 27/0255 257/72 |
| 2015/0155212 | A1 * | 6/2015 | Park ................ G02F 1/136259 257/48 |
| 2015/0160508 | A1 * | 6/2015 | Kim ................. G02F 1/133526 349/200 |
| 2015/0301420 | A1 * | 10/2015 | Yoshida ............. G02F 1/1345 257/43 |

FOREIGN PATENT DOCUMENTS

| KR | 1020040015584 | 2/2004 |
| KR | 1020050003511 | 1/2005 |
| KR | 1020070017625 | 2/2007 |

* cited by examiner

*Primary Examiner* — Evren Seven
(74) *Attorney, Agent, or Firm* — F. Chau & Associates, LLC (57) ABSTRACT

A display panel includes a substrate including a display area displaying an image and a peripheral area. A plurality of shorting bar connection parts are formed in the peripheral area. A plurality of step adjustment parts are formed on the plurality of shorting bar connection parts. A plurality of pad parts are formed on the plurality of step adjustment parts. Each of the pad parts is connected to a first end of the shorting bar connection parts through a first contact hole. A plurality of shorting bar pads is formed on the plurality of shorting bar connection parts. Each of the shorting bar pads is connected to a second end of the shorting bar connection parts through a second contact hole. The plurality of shorting bar connection parts are formed in lower regions of the plurality of pad parts. The shorting bar connection parts overlap each other.

20 Claims, 13 Drawing Sheets

DISPLAY PANEL HAVING A REDUCED DEAD SPACE

CROSS-REFERENCE TO RELATED APPLICATION

This application claims priority under 35 U.S.C. §119 to Korean Patent Application No. 10-2015-0052487 filed in the Korean Intellectual Property Office on Apr. 14, 2015, the disclosure of which is incorporated by reference herein in its entirety.

(a) TECHNICAL FIELD

Exemplary embodiments of the present invention relate to a display panel, and more particularly to a display panel having a reduced dead space.

(b) DISCUSSION OF RELATED ART

A display panel of an organic light emitting display may be manufactured using a process of forming a plurality of display panels having cutting lines on a mother substrate and then cutting the cutting lines at an edge of each display panel.

Manufacturing costs may be reduced and productivity may be increased by increasing the number of display panels which may be manufactured by one mother substrate. A one-step cutting process in which a number of unit panels are manufactured from the mother substrate by one cutting process has been used.

Internal wirings such as a gate line and a data line formed in a display area of each display panel may be connected to a shorting bar through a wiring pad extended to a peripheral area. The shorting bar may prevent the display panel from being damaged by determining whether or not the internal wirings are normal and temporarily cutting off electrostatic energy generated during the process.

However, in the case in which the display panel is manufactured using the one-step cutting process, after a shorting bar connection part is formed in an extension direction of the wiring pad, a shorting bar pad part may be formed in an extension direction of the shorting bar connection part and the shorting bar wiring may be connected to the shorting bar pad part.

Each display panel may separately require a space for forming the shorting bar connection part which may connect the shorting bar wiring and the pad part to each other, and there may be a problem that an area occupied by a dead space, which may be an area which does not contribute to a display between the display area and the cutting line is increased in the manufactured display panel.

The shorting bar wiring is generally removed by the cutting process. In this case, since the display panel may be manufactured in a state in which a portion of the shorting bar connection part is exposed to the outside, there may be a problem that the exposed portion of the shorting bar connection part serves as an antenna in which undesired resistance is introduced into the display panel.

SUMMARY

Exemplary embodiments of the present invention may provide a display panel having a reduced dead space in the display panel and preventing undesired external resistance from being introduced into the panel.

An exemplary embodiment of the present invention provides a display panel including a substrate including a display area displaying an image and a peripheral area surrounding the display area. A plurality of shorting bar connection parts are formed in the peripheral area of the substrate. A plurality of step adjustment parts are formed on the plurality of shorting bar connection parts. A plurality of pad parts are formed on the plurality of step adjustment parts. Each of the pad parts is connected to a first end of the shorting bar connection parts through a first contact hole. A plurality of shorting bar pads is formed on the plurality of shorting bar connection parts. Each of the shorting bar pads is connected to a second end of the shorting bar connection parts through a second contact hole. The plurality of shorting bar connection parts is formed in lower regions of the plurality of pad parts. The shorting bar connection parts overlap each other.

The plurality of shorting bar pads may be connected to a shorting bar wiring. The shorting bar wiring may be disposed in a direction perpendicular to a direction in which the plurality of shorting bar pads are extended.

The display panel may include a first insulating layer formed on the plurality of shorting bar connection parts. A second insulating layer may be formed on the plurality of step adjustment parts. The second insulating layer may cover the first insulating layer. The first contact hole and the second contact hole may be formed in the first insulating layer and the second insulating layer.

The plurality of pad parts and some region of the plurality of shorting bar pads may be formed on a same layer.

The plurality of pad parts and the plurality of shorting bar pads may include a same material.

The first contact hole may be adjacent to a first end of the plurality of step adjustment parts. The second contact hole may be adjacent to a second end of the plurality of step adjustment parts.

The display panel may include a first insulating layer formed on the plurality of shorting bar connection parts. A second insulating layer may cover the plurality of step adjustment parts and may expose the first insulating layer. The first contact hole may be formed in the first insulating layer and the second insulating layer. The second contact hole may be formed in the second insulating layer.

The plurality of step adjustment parts and some region of the plurality of shorting bar pads may be formed on the same layer.

The step adjustment parts and the plurality of shorting bar pads may include a same material.

The first contact hole may be adjacent to a first end of the plurality of step adjustment parts. The second contact hole may be adjacent to a lower region of a second end of the plurality of step adjustment parts.

According to an exemplary embodiment of the present invention, the display panel may reduce a size of a dead space, which is the area which might not contribute to the display and may prevent undesired external resistance from being introduced into the display panel.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION OF THE EMBODIMENTS

Hereinafter, in the following detailed description, the present invention will be described more fully hereinafter with reference to the accompanying drawings, in which exemplary embodiments of the present invention are shown. As those skilled in the art would realize, exemplary embodiments of the present invention may be modified in various different ways, all without departing from the spirit or scope of the present invention.

Throughout the specification and drawings, when an element such as a layer, film, region, or substrate is referred to as being "on" another element, it may be directly on the other element or intervening elements may also be present. Throughout the specification and drawings, when an element is referred to as being "on" another element, it may mean that the element is positioned on or below a target portion, and does not necessarily mean that the element is positioned at an upper side based on a gravity direction.

Sizes and thicknesses of the respective components shown in the drawings are not necessarily limited to those shown in the drawings.

Figure 1:
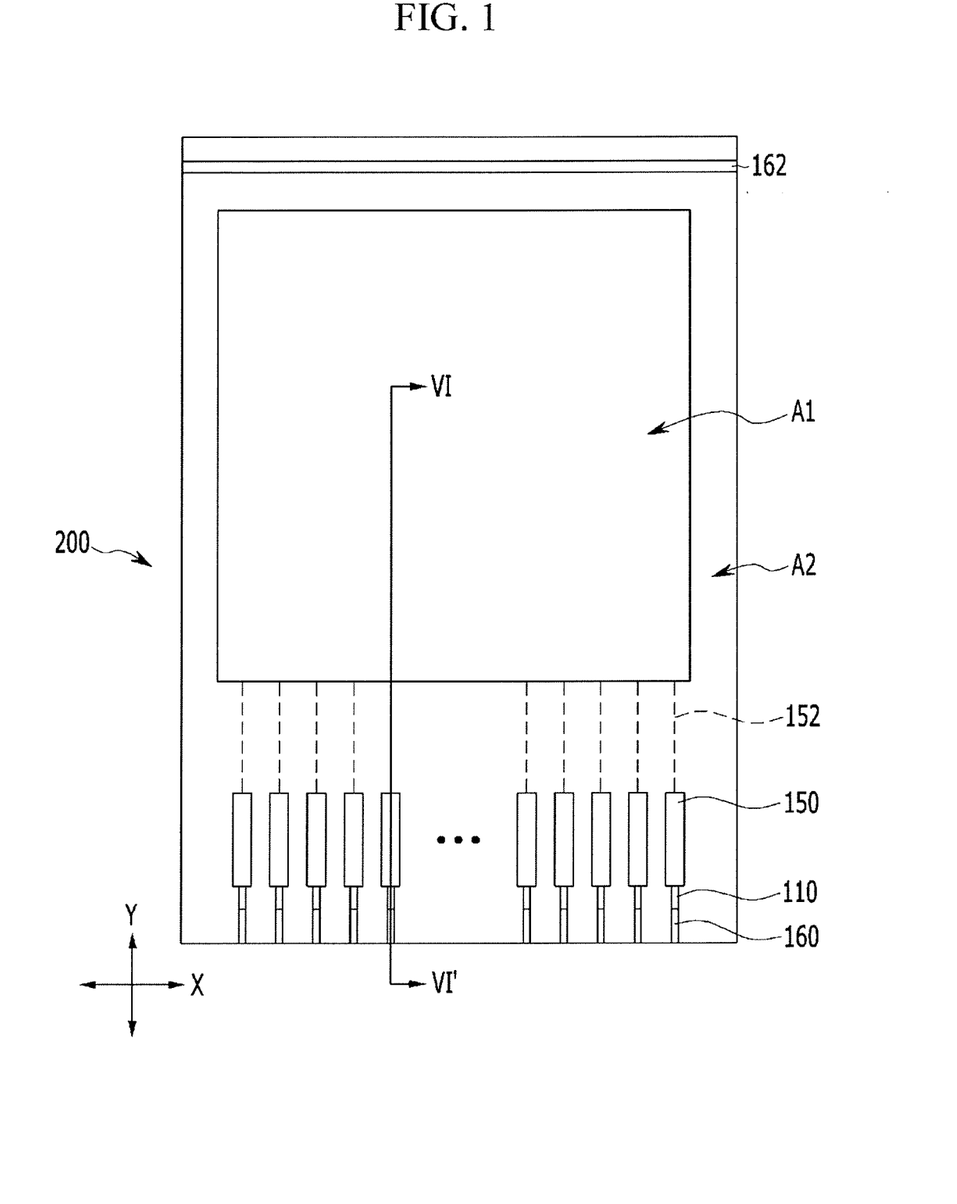
FIG. 1 shows a display panel according to an exemplary embodiment of the present invention.

FIG. 1 shows a display panel according to an exemplary embodiment of the present invention.

Referring to FIG. 1, each unit display panel 200 may include a display area A1 in which an image may be displayed, and a substrate 100 in which a peripheral area A2 surrounding the display area A1 may be formed. The peripheral area A2 may include a plurality of pad parts 150 and a plurality of shorting bar pads 160.

The display area A1 may be spaced apart from an edge of the display panel by a predetermined distance. An area which is present between the display area A1 and a cutting line and does not display an image, such as an upper region and a lower region in a y axis direction, may be generally referred to as a dead space.

The display area A1 on the substrate 100 may include a plurality of pixels for displaying the image.

Figure 2:
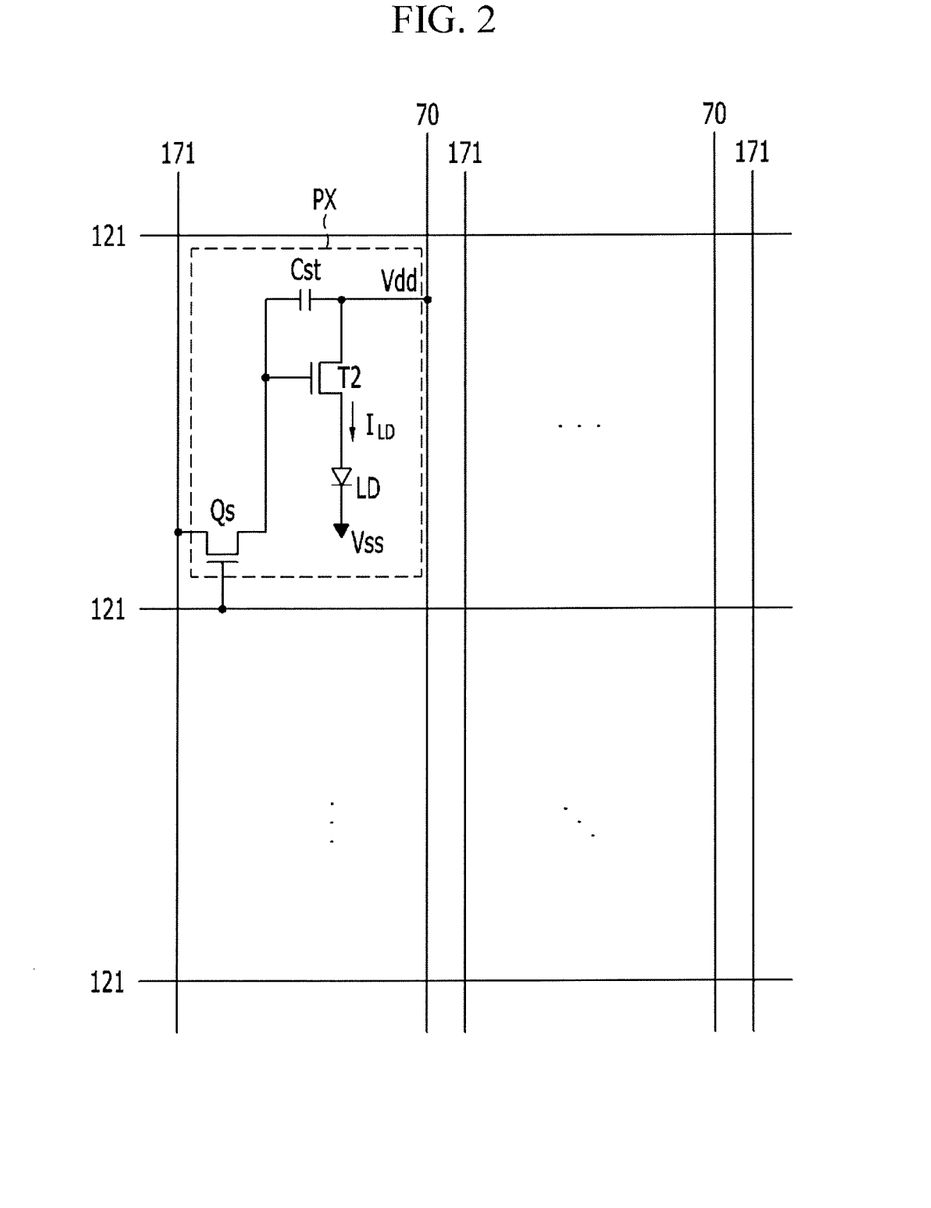
FIG. 2 illustratively shows an equivalent circuit diagram of each pixel included in a display area of FIG. 1.

FIG. 2 illustratively shows an equivalent circuit diagram of each pixel included in a display area of FIG. 1.

Referring to FIG. 2, each display area A1 may include a plurality of signal lines 121, 171, and 70, and a plurality of pixels PX connected to the plurality of signal lines 121, 171, and 70 and arranged approximately in a matrix shape.

The signal lines may include a plurality of gate lines 121 transferring a gate signal (or a scan signal), a plurality of data lines 171 transferring a data signal, and a plurality of driving voltage lines 70 transferring a driving voltage Vdd. The gate lines 121 may be extended in approximately a row direction and may be substantially parallel to each other. The data lines 171 and the driving voltage lines 172 may be extended in approximately a column direction and may be substantially parallel to each other.

Each pixel PX may include a switching thin film transistor Qs, a driving thin film transistor T2, a storage capacitor Cst, and an organic light emitting diode (OLED) LD.

The switching thin film transistor Qs may include a control terminal, an input terminal, and an output terminal. The control terminal may be connected to the gate line 121, the input terminal may be connected to the data line 171, and the output terminal may be connected to the driving thin film transistor T2. The switching thin film transistor Qs may transfer the data signal applied to the data line 171 to the driving thin film transistor T2 in response to the scan signal applied to the gate line 121.

The driving thin film transistor T2 may include a control terminal, an input terminal, and an output terminal. The control terminal may be connected to the switching thin film transistor Qs, the input terminal may be connected to the driving voltage line 70, and the output terminal may be connected to the organic light emitting diode LD. In this case, the driving thin film transistor T2 may allow an output current $I_{LD}$ to flow. A magnitude of the output current $I_{LD}$ may be varied depending on a voltage between the control terminal and the output terminal.

The storage capacitor Cst may be connected between the control terminal and the input terminal of the driving thin film transistor T2. The storage capacitor Cst may be charged with the data signal applied to the control terminal of the driving thin film transistor T2 and may maintain the data signal even after the switching thin film transistor Qs is turned-off.

The organic light emitting diode LD may include an anode connected to the output terminal of the driving thin film transistor T2 and a cathode connected to a common voltage Vss. In this case, the organic light emitting diode LD may display an image by emitting light having different intensities depending on the output current $I_{LD}$ of the driving thin film transistor T2.

Referring to FIG. 1, the peripheral area A2 may include the plurality of pad parts 150 connected to the plurality of signal lines 121, 171, and 70. One end of each of the plurality of pad parts 150 may include the pad connection part 152. Each of the pad connection parts 152 may be connected to at least one of the plurality of signal lines 121, 171, and 70.

The other ends of each of the plurality of pad parts 150 may be connected to shorting bar connection parts 110 overlapped with each other in lower regions of the pad parts 150 through a first contact hole 151 (described in more detail below), and the shorting bar connection parts 110 may be connected to shorting bar pads 160 through a second contact hole 161 (described in more detail below). In this case, a first insulating layer 120 and/or a second insulating layer 140 may be disposed on the shorting bar connection parts 110. Since the insulating layers (e.g., insulating layers 120 and/or 140) may be transparent layers, FIG. 1 shows the shorting bar connection parts 110 without insulating layers.

The plurality of shorting bar pads 160 may be spaced apart from each other at a substantially constant distance.

A shorting bar wiring 162 may be connected to the shorting bar pads 160. The shorting bar wirings 162 may reduce or prevent an introduction of electrostatic energy generated during a process of manufacturing the display panel. For example, the shorting bar wiring 162 may vertically intersect with a direction in which the shorting bar pads 160 are extended.

Figure 3:
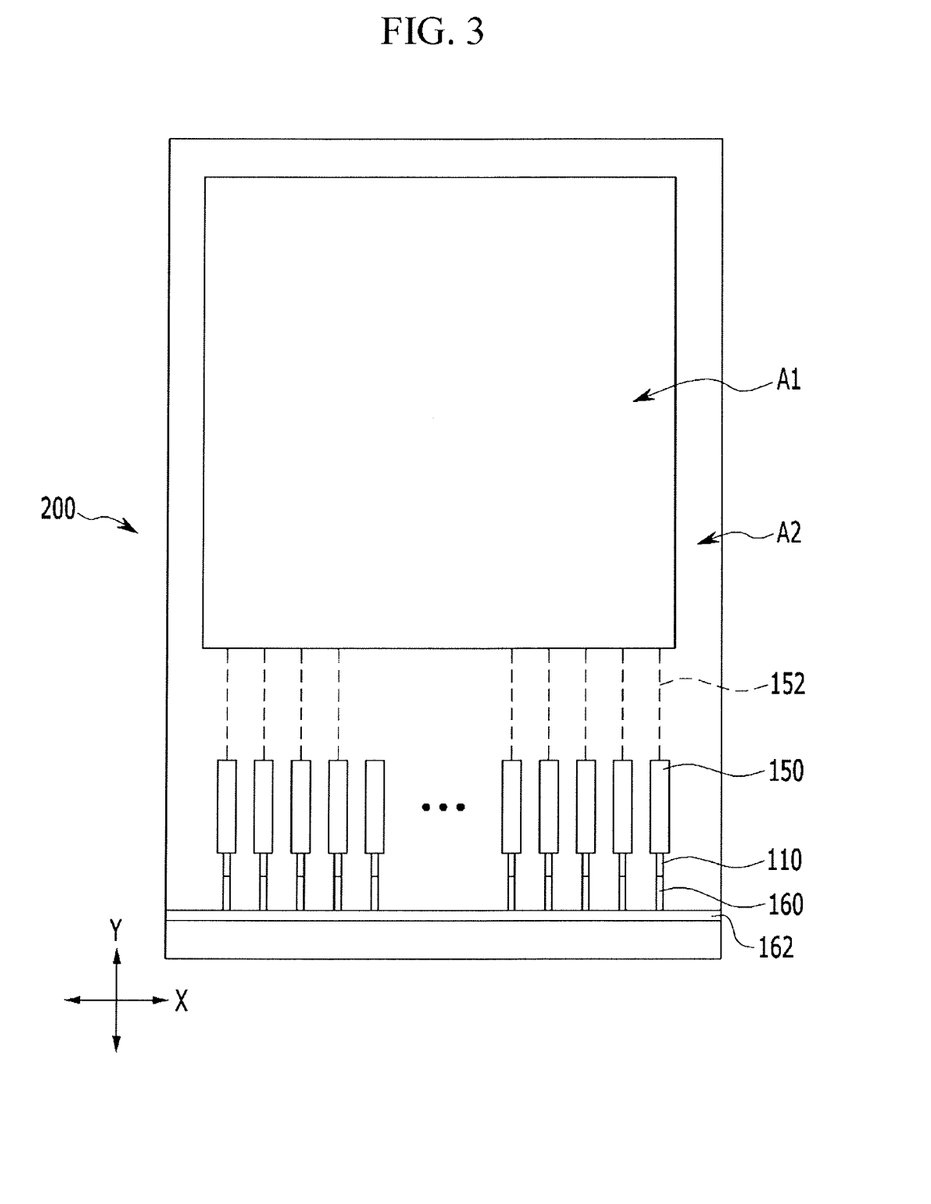
FIG. 3 shows a display panel according to another exemplary embodiment of the present invention.

When a one-step cutting process is used to manufacture the display panel 200 according to an exemplary embodiment of the present invention, a position of the shorting bar wiring 162 in the manufactured display panel 200 may be varied depending on a position of the cutting line formed between the substrate and a neighboring substrate. For example, the shorting bar wiring 162 may be disposed in an upper region with respect to a y axis direction of the display panel 200 in a state in which it is separated from the shorting bar pads 160, as shown in FIG. 1, or the shorting bar wiring 162 may be disposed in a lower region with respect to the y axis direction of the display panel 200 in a state in which it is connected to the shorting bar pads 160, as shown in FIG. 3.

The display panel 200 according to an exemplary embodiment of the present invention will be described in more detail below with reference to FIG. 4.

Figure 4:
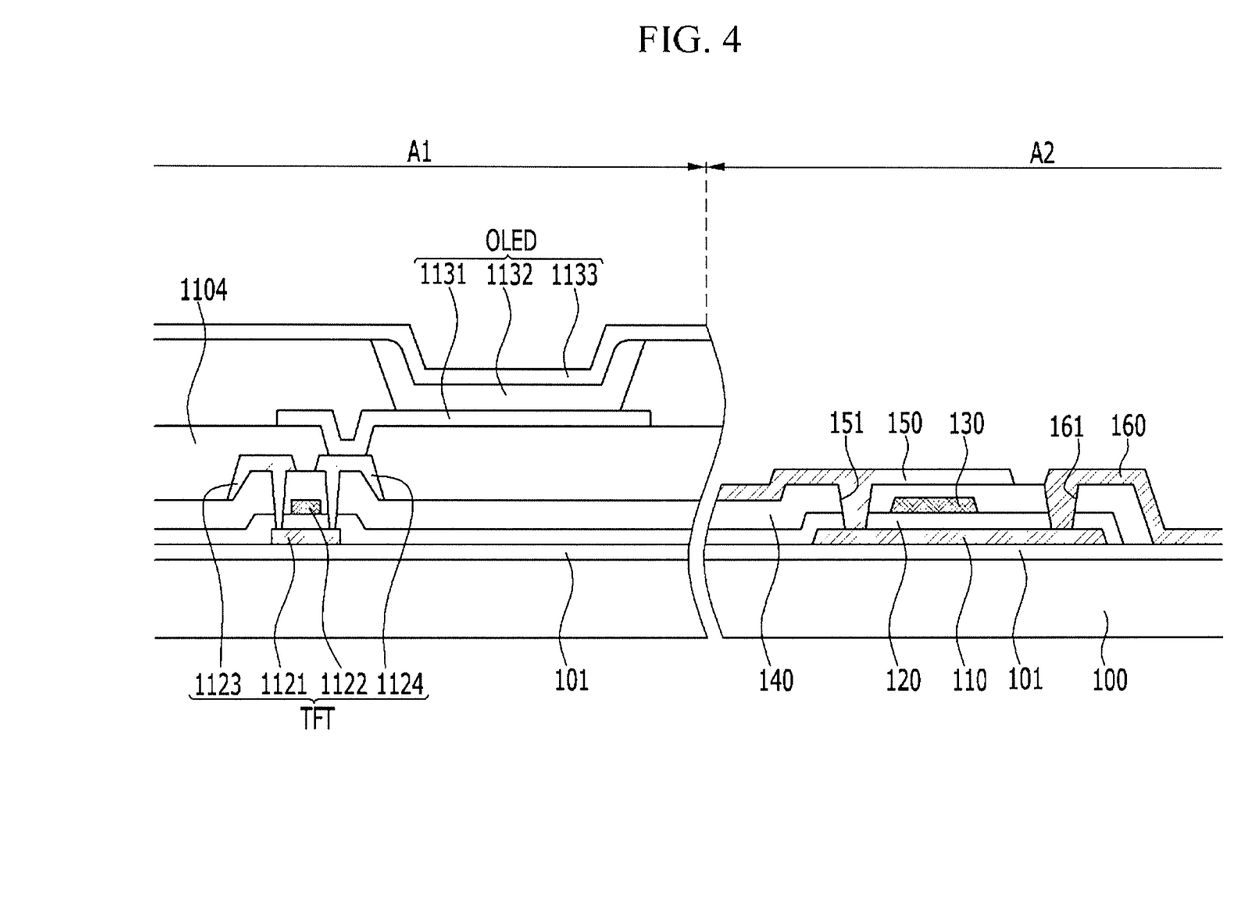
FIG. 4 is a partially enlarged view showing an example of a portion of a cross section taken along a cutting line VI-VI' of FIG. 1.

FIG. 4 is a partially enlarged view showing an example of a portion of a cross section taken along a cutting line VI-VI' of FIG. 1. A switching transistor and a driving transistor included in the display area A1 may have a similar interlayer configuration. The driving transistor is shown in the display area A1 of FIG. 4 and the following description may apply to both the switching transistor and the driving transistor.

Referring to FIG. 4, a buffer layer 101 may be disposed on the substrate 100, and an active layer 1121 may be disposed in the display area A1. A shorting bar connection part 110 may be disposed in the peripheral area A2. The shorting bar connection part 110 may be disposed on the buffer layer 101.

The substrate 100 may be a rigid substrate. The substrate 100 may include glass, quartz, or metal. The substrate 100 may be a flexible substrate and may include a plastic film. The substrate 100 may include a polymer material having relatively high heat resistance and relatively high durability such as polyimide or polycarbonate.

The buffer layer 101 may reduce or prevent permeation of impurity elements through the substrate 100 and may provide a flat surface to an upper portion of the substrate 100. The buffer layer 101 may include an inorganic material such as $SiO_2$, or SiNx, or an organic material such as polyimide, polyester, or acrylic, but exemplary embodiments of the present invention are not limited thereto.

The active layer 1121 and the shorting bar connection part 110 may be disposed on the buffer layer 101. The active layer 1121 may be disposed in the display area A1 and the shorting bar connection part 110 may be disposed in the peripheral area A2.

The active layer 1121 and the shorting bar connection part 110 may include the same material. For example, the active layer 1121 and the shorting bar connection part 110 may include polysilicon or an oxide semiconductor, but exemplary embodiments of the present invention are not limited thereto. When the active layer 1121 and the shorting bar connection part 110 include the oxide semiconductor, a separate passivation layer may be disposed on the active layer 1121 and the shorting bar connection part 110.

The first insulating layer 120 may be disposed on the active layer 1121 and the shorting bar connection part 110. The first insulating layer 120 may insulate a gate electrode 1122 disposed in the display area A1 and a step adjustment part 130 disposed in the peripheral area A2. The first insulating layer 120 may include, for example, an inorganic material such as $SiO_2$ or SiNx, or an organic material, and may include a single layer or a plurality of layers.

The gate electrode 1122 and the step adjustment part 130 may be disposed on the first insulating layer 120. The gate electrode 1122 may be disposed in the display area A1 and the step adjustment part 130 may be disposed in the peripheral area A2.

The gate electrode 1122 and the step adjustment part 130 may include the same material. The gate electrode 1122 and the step adjustment part 130 may include, for example, a relatively low resistance material or a material having relatively high corrosion resistance such as gold (Au), silver (Ag), copper (Cu), nickel (Ni), platinum (Pt), palladium (Pd), aluminum (Al), molybdenum (Mo), or an alloy thereof.

The second insulating layer 140 may be disposed on the gate electrode 1122 and the step adjustment part 130. The second insulating layer 140, which may insulate source and drain electrodes in the display area A1 and may insulate the pad part 150 in the peripheral area A2, may include an inorganic material such as $SiO_2$ or SiNx and may have a single layer structure, a two-layer structure including a $SiO_2$ layer and a SiNx layer, or a triple-layer structure including a SiNx layer, a $SiO_2$ layer, and a SiNx layer, but exemplary embodiments of the present invention are not limited thereto.

According to an exemplary embodiment of the present invention, the second insulating layer 140 disposed in the peripheral area A2 may cover the step adjustment part 130 and the first insulating layer 120, as shown in FIG. 4.

In the peripheral area A2, the plurality of pad parts 150 and the plurality of shorting bar pads 160 may be disposed and spaced apart from each other on the second insulating layer 140. The shorting bar wiring 162 may be connected to the shorting bar pads 160 in a vertical direction. The shorting bar pads 160 and the shorting bar wiring 162 may be simultaneously formed of the same material and may be connected to each other.

The plurality of pad parts 150 and the plurality of shorting bar pads 160 may include the same material. For example, the plurality of pad parts 150 and the plurality of shorting bar pads 160 may include gold (Au), silver (Ag), copper (Cu), nickel (Ni), platinum (Pt), palladium (Pd), aluminum (Al), molybdenum (Mo), or an alloy thereof.

Driving parts connected to the pad parts 150 may be disposed in the plurality of pad parts 150, and the driving parts may include a chip on film (COF). The plurality of pad parts 150 may be connected to the plurality of signal lines disposed in the display area A1 through the driving parts. First contact holes 151 connecting first ends of the plurality of shorting bar connection parts 110 and the plurality of pad parts 150 to each other and second contact holes 161 connecting second ends of the plurality of shorting bar connection parts 110 and the plurality of shorting bar pads 160 to each other may be disposed in the first insulating layer 120 and the second insulating layer 140 disposed in the peripheral area A2.

In the display area A1, a source electrode 1123 and a drain electrode 1124 may be disposed on the second insulating layer 140. Via holes may be disposed in the second insulating layer 140 and the first insulating layer 120 and may expose a source region and a drain region of the active layer 1121, and through the via holes, the source electrode 1123 may be in contact with the source region and the drain electrode 1124 may be in contact with the drain region.

A thin film transistor (TFT) of a top gate type may be disposed in the display area A1, but a structure of the thin film transistor (TFT) according to exemplary embodiments of the present invention is not limited thereto. The thin film transistor (TFT) may be covered with a passivation layer 1104, which may protect the thin film transistor (TFT). The thin film transistor (TFT) may be electrically connected to an organic light emitting diode (OLED) and may drive the organic light emitting diode (OLED).

The passivation layer 1104 may include an inorganic insulating layer or an organic insulating layer, and may have a structure in which the inorganic insulating layer and the organic insulating layer are stacked. The inorganic insulating layer may include $SiO_2$, SiNx, $Al_2O_3$, $TiO_2$, $Ta_2O_5$, $HfO_2$, or $ZrO_2$, and the organic insulating layer may include polymethacylate methyl (PMMA), polystyrene (PS), acrylic based polymer, imide based polymer, or arylether based polymer.

The organic light emitting diode (OLED) may be disposed on the passivation layer 1104, and may include a pixel electrode 1131, an organic light emitting layer 1132, and a common electrode 1133. One pixel electrode 1131 may be disposed in each sub-pixel, and may be in contact with the drain electrode 1124 through the via hole disposed in the passivation layer 1104. The common electrode 1133 may be entirely disposed in the display area A1. The organic light emitting layer 1132 may include a light emitting layer, and may include at least one of a hole injection layer, a hole transport layer, an electronic transport layer, and an electronic injection layer.

Processes of forming the shorting bar connection part 110, the first insulating layer 120, the step adjustment part 130, the second insulating layer 140, the pad part 150, the shorting bar pad 160, and the shorting bar wiring 162 in the peripheral area A2 will be described in more detail below with reference to FIGS. 6 to 10.

FIGS. 5 to 9 show processes of forming the components included in a peripheral area of FIG. 4.

Figure 5:
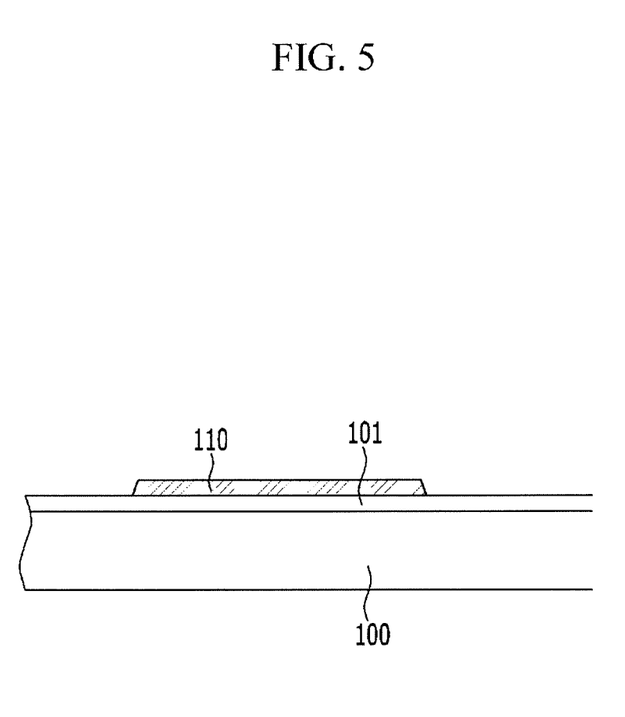
FIGS. 5 to 9 show processes of forming the components included in a peripheral area of FIG. 4.

Referring to FIG. 5, the shorting bar connection part 110 may be formed on the substrate 100 on which the buffer layer 101 may be formed, by a photolithography process. The active layer 1121 of the display area A1 may be formed by the same process.

Figure 6:
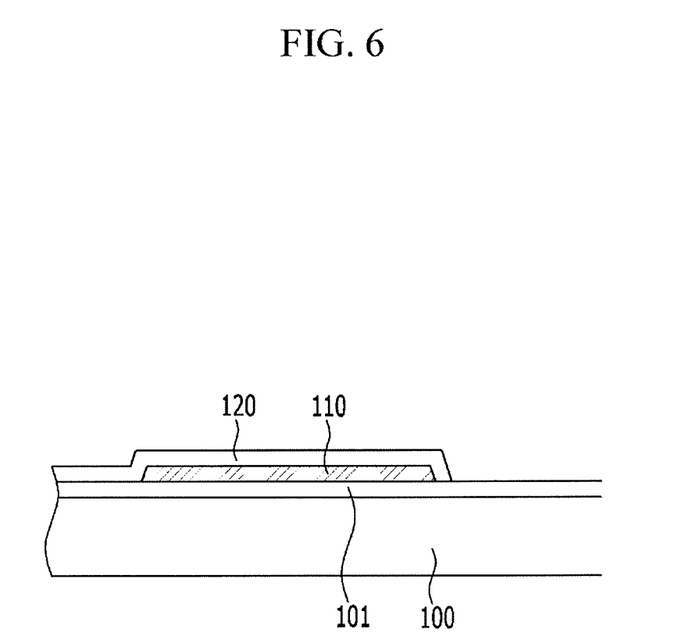
Figure 7:
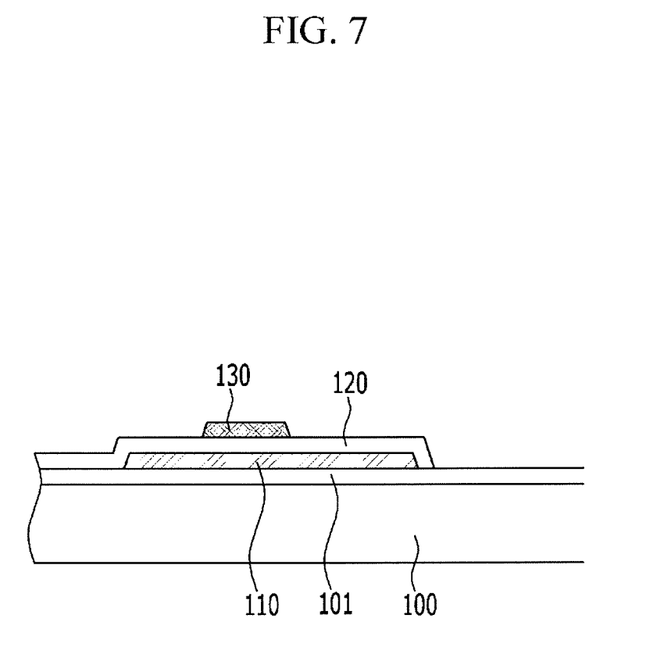

Referring to FIGS. 6 and 7, the first insulating layer 120 may be formed on the plurality of shorting bar connection parts 110. A metal layer may be stacked on the first insulating layer 120 and the step adjustment part 130 may be formed by the photolithography process. The gate electrode 1122 of the display area A1 may be formed by the same process.

Figure 8:
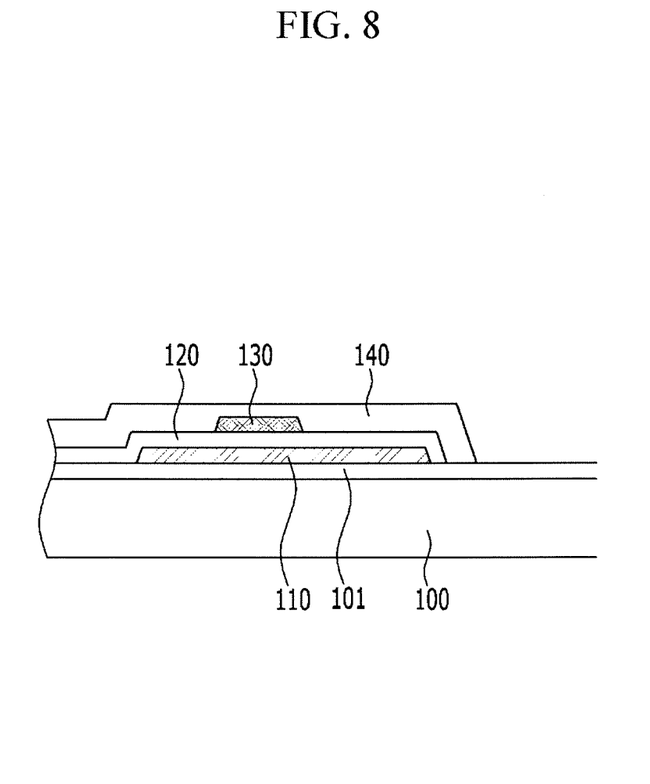

Referring to FIG. 8, the second insulating layer 140 may be formed to cover both the step adjustment part 130 and the first insulating layer 120.

Figure 9:
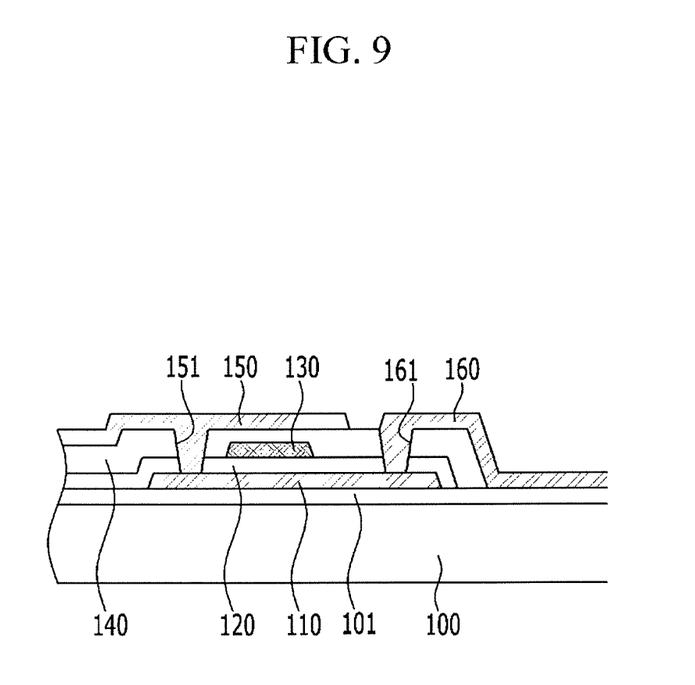

Referring to FIG. 9, the first contact hole 151 and the second contact hole 161 may be formed in the first insulating layer 120 and the second insulating layer 140 by the photolithography process, the metal layer may be deposited, and the pad part 150, the shorting bar pad 160, and the shorting bar wiring 162 may then be formed by the photolithography process. Thus, the pad part 150 and some regions of the shorting bar pad 160 connected to the second contact hole 161 may be formed on the same layer.

The first contact hole 151 and the second contact hole 161 may each be formed spaced apart from ends of the plurality of step adjustment parts 130.

The first contact hole 151 may connect the first end of the shorting bar connection part 110 and the pad part 150 to each other, and the second contact hole 161 may connect the second end of the shorting bar connection part 110 and the shorting bar pad 160 to each other.

Figure 10:
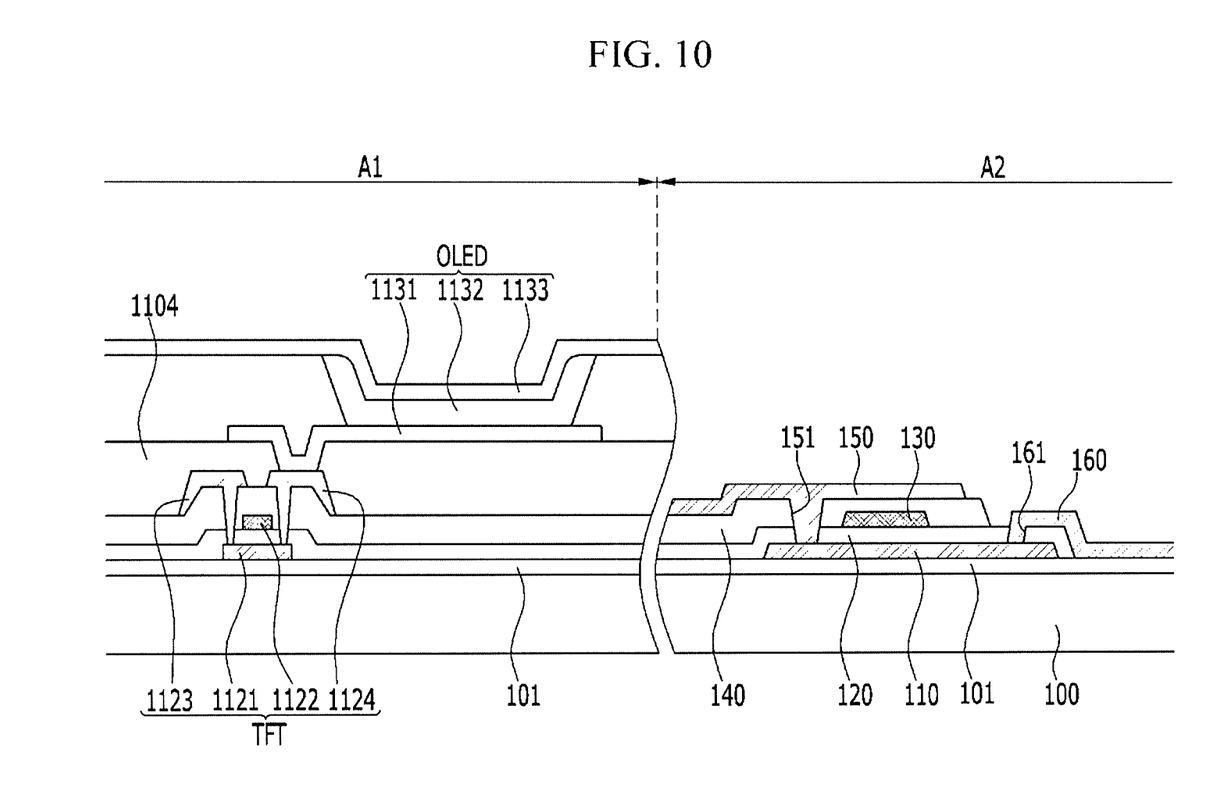
FIG. 10 is a partially enlarged view showing another example of the portion of the cross section taken along the cutting line VI-VI' of FIG. 1.

In each unit display panel 200 according to an exemplary embodiment of the present invention, the peripheral area A2 may have a structure shown in FIG. 10.

FIG. 10 is a partially enlarged view showing another example of the portion of the cross section taken along the cutting line VI-VP of FIG. 1.

A method for forming the shorting bar connection part 110 and the first insulating layer 120 may be substantially the same as that described above, and duplicative description may be omitted.

Figure 11:
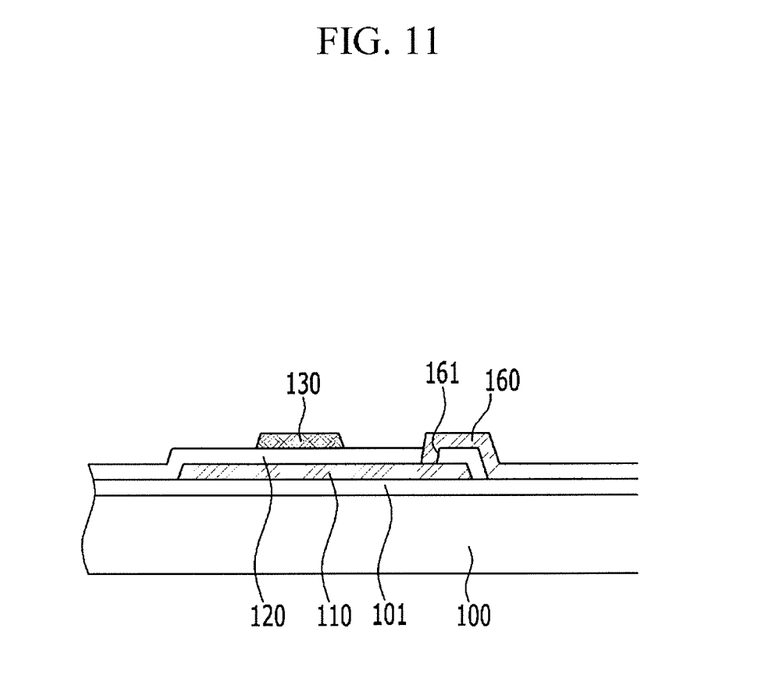
FIGS. 11 to 13 show processes of forming the components included in a peripheral area of FIG. 10.
Figure 12:
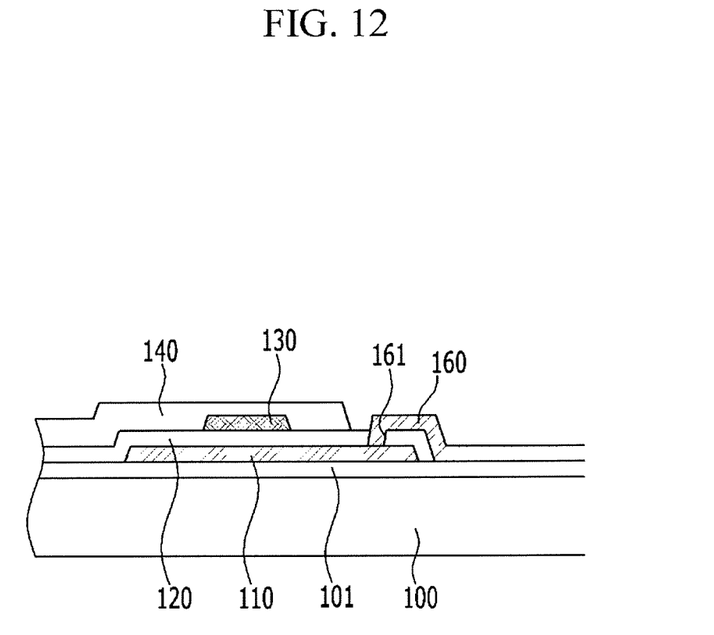
Figure 13:
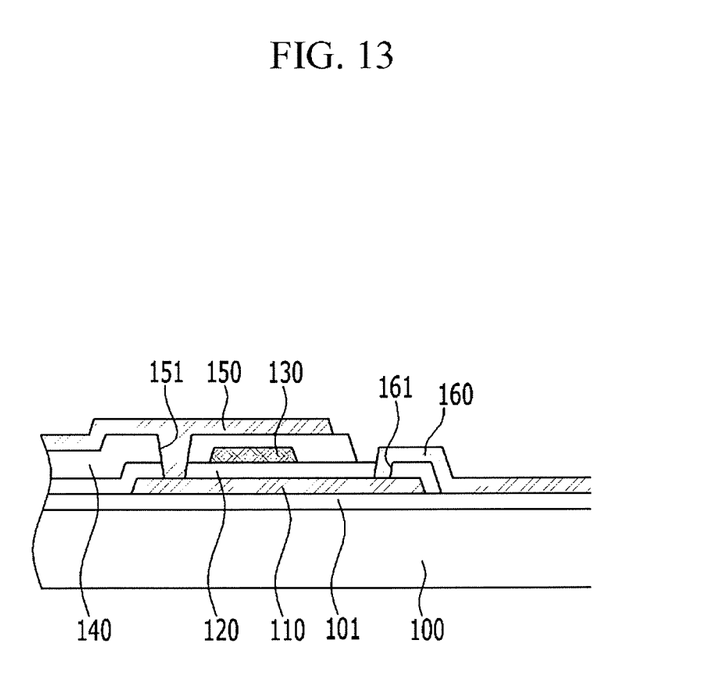

FIGS. 11 to 13 show processes of forming the components included in a peripheral area of FIG. 10.

Referring to FIGS. 11 to 13, the step adjustment part 130 and the shorting bar pad 160 may be formed on the first insulating layer 120 in the peripheral area A2 and then the second insulating layer 140 and the pad part 150 may be formed.

The shorting bar connection part 110 and the first insulating layer 120 may be formed on the substrate 100 on which the buffer layer 101 is formed, by the same method as that described above, the second contact hole 161 may be formed in the first insulating layer 120 by the photolithography process. The metal may layer may be deposited, and the step adjustment part 130, the shorting bar pad 160, and the shorting bar wiring 162 may then be formed by the photolithography process. Thus, the step adjustment part 130 and the shorting bar pad 160 may be formed on the same layer.

The second contact hole 161 may connect the first end of the shorting bar connection part 110 and the shorting bar pad 160 to each other.

Referring to FIG. 12, the second insulating layer 140 may be formed to cover the step adjustment part 130.

Referring FIG. 13, the first contact hole 151 may be formed in the first insulating layer 120 and the second insulating layer 140 by the photolithography process, the metal layer may be deposited, and the pad part 150 may then be formed by the photolithography process. The first contact hole 151 may connect the second end of the shorting bar connection part 110 and the pad part 150 to each other.

Thus, the first contact hole 151 may be spaced apart from one end of the plurality of step adjustment parts 130, and the second contact hole 161 may be spaced apart from lower regions of the other ends of the plurality of step adjustment parts 130.

According to an exemplary embodiment of the present invention, since the shorting bar connection parts 110 may be formed in the lower region of the pad part 150 formed in the peripheral area A2 so that portions of half or more of the shorting bar connection parts 110 are overlapped with each other, a space for forming the shorting bar connection parts 110 which is finally connected to the shorting bar wiring 162 may be omitted, and thus a size of a dead space may be reduced in each unit display panel 200. For example, the size of the dead space in the y axis direction may be reduced.

According to an exemplary embodiment of the present invention, since the second contact hole 161 connecting the shorting bar connection part 110 and the shorting bar pad 160 to each other may be formed in each display panel 200, the shorting bar connection part 110 need not be exposed to the outside even in a case of the display panel manufactured after the cutting process. Thus, it may be possible to reduce or prevent a problem that undesired external resistance is introduced into the panel through the shorting bar connection part 110, or that the shorting bar connection part 110 is exposed to the outside and is corroded.

While the present invention has been shown and described with reference to the exemplary embodiments thereof, it will be apparent to those of ordinary skill in the art that various changes in form and detail may be made thereto without departing from the spirit and scope of the present invention.

What is claimed is:
1. A display panel comprising:
   a substrate including a display area displaying an image and a peripheral area surrounding the display area;
   a plurality of shorting bar connection parts formed in the peripheral area of the substrate;
   a plurality of step adjustment parts formed on the plurality of shorting bar connection parts;

a plurality of pad parts formed on the plurality of step adjustment parts, wherein each of the pad parts is connected to a first end of the shorting bar connection part through a first contact hole; and a plurality of shorting bar pads formed on the plurality of shorting bar connection parts, wherein each of the shorting bar pads is connected to a second end of the shorting bar connection parts through a second contact hole, wherein the plurality of shorting bar connection parts are formed in lower regions of the plurality of pad parts, and wherein the shorting bar connection parts overlap with a portion of the plurality of pad parts in a plan view.

2. The display panel of claim 1, wherein:
the plurality of shorting bar pads is connected to a shorting bar wiring, and the shorting bar wiring is disposed in a direction perpendicular to a direction in which the plurality of shorting bar pads are extended.

3. The display panel of claim 1, further comprising:
a first insulating layer formed on the plurality of shorting bar connection parts; and
a second insulating layer formed on the plurality of step adjustment parts, wherein the second insulating layer covers the first insulating layer, and
wherein the first contact hole and the second contact hole are formed in the first insulating layer and the second insulating layer.

4. The display panel of claim 3, wherein:
the plurality of pad parts and some region of the plurality of shorting bar pads are formed on a same layer.

5. The display panel of claim 3, wherein:
the plurality of pad parts and the plurality of shorting bar pads include a same material.

6. The display panel of claim 3, wherein:
the first contact hole is adjacent to a first end of the plurality of step adjustment parts, and the second contact hole is adjacent to a second end of the plurality of step adjustment parts.

7. The display panel of claim 1, further comprising:
a first insulating layer formed on the plurality of shorting bar connection parts; and
a second insulating layer covering the plurality of step adjustment parts and exposing the first insulating layer,
wherein the first contact hole is formed in the first insulating layer and the second insulating layer, and
wherein the second contact hole is formed in the second insulating layer.

8. The display panel of claim 7, wherein:
the plurality of step adjustment parts and some region of the plurality of shorting bar pads are formed on the same layer.

9. The display panel of claim 7, wherein:
the plurality of step adjustment parts and the plurality of shorting bar pads include a same material.

10. The display panel of claim 7, wherein:
the first contact hole is adjacent to a first end of the plurality of step adjustment parts, and
the second contact hole is adjacent to a lower region of a second end of the plurality of step adjustment parts.

11. A shorting bar, comprising:
a substrate;
a plurality of shorting bar connection parts disposed on the substrate;
a plurality of step adjustment parts disposed on the plurality of shorting bar connection parts;
a plurality of pad parts disposed on the plurality of step adjustment parts, wherein each of the plurality of pad parts is connected to a first end of the plurality of shorting bar connection parts through a first contact hole; and
a plurality of shorting bar pads disposed on the plurality of shorting bar connection parts, wherein each of the plurality of shorting bar pads is connected to a second end of the shorting bar connection parts through a second contact hole,
wherein the plurality of shorting bar connection parts are formed in lower regions of the plurality of pad parts, and wherein the shorting bar connection parts overlap with a portion of the plurality of pad parts in a plan view.

12. The shorting bar of claim 11, wherein:
the plurality of shorting bar pads is connected to a shorting bar wiring, and the shorting bar wiring is disposed in a direction perpendicular to a direction in which the plurality of shorting bar pads are extended.

13. The shorting bar of claim 11, further comprising:
a first insulating layer formed on the plurality of shorting bar connection parts; and
a second insulating layer formed on the plurality of step adjustment parts, wherein the second insulating layer covers the first insulating layer, and
wherein the first contact hole and the second contact hole are formed in the first insulating layer and the second insulating layer.

14. The shorting bar of claim 13, wherein:
the plurality of pad parts and some region of the plurality of shorting bar pads are formed on a same layer.

15. The shorting bar of claim 13, wherein:
the plurality of pad parts and the plurality of shorting bar pads include a same material.

16. The shorting bar of claim 13, wherein:
the first contact hole is adjacent to a first end of the plurality of step adjustment parts, and the second contact hole is adjacent to a second end of the plurality of step adjustment parts.

17. The shorting bar of claim 11, further comprising:
a first insulating layer formed on the plurality of shorting bar connection parts; and
a second insulating layer covering the plurality of step adjustment parts and exposing the first insulating layer,
wherein the first contact hole is formed in the first insulating layer and the second insulating layer, and
wherein the second contact hole is formed in the second insulating layer.

18. The shorting bar of claim 17, wherein:
the plurality of step adjustment parts and some region of the plurality of shorting bar pads are formed on the same layer.

19. The shorting bar of claim 17, wherein:
the plurality of step adjustment parts and the plurality of shorting bar pads include a same material.

20. The shorting bar of claim 17, wherein:
the first contact hole is adjacent to a first end of the plurality of step adjustment parts, and
the second contact hole is adjacent to a lower region of a second end of the plurality of step adjustment parts.

* * * * *